United States Patent [19]

Mouissie

[11] 4,169,642

[45] Oct. 2, 1979

[54] INTEGRATED CIRCUIT CONNECTOR

[75] Inventor: Bob Mouissie, Berlicum, Netherlands

[73] Assignee: E. I. Du Pont de Nemours and Company, Wilmington, Del.

[21] Appl. No.: 833,576

[22] Filed: Sep. 15, 1977

[30] Foreign Application Priority Data

Sep. 16, 1976 [NL] Netherlands .......................... 7610306

[51] Int. Cl.² .............................................. H05K 1/12
[52] U.S. Cl. .................................... 339/17 F; 361/398
[58] Field of Search ............. 339/17 R, 17 F, 17 CF, 339/17 M, 176 MF; 361/398

[56] References Cited

U.S. PATENT DOCUMENTS

| 3,629,787 | 12/1971 | Wilson | 339/17 F |
| 3,924,915 | 12/1975 | Conrad | 339/17 F |

FOREIGN PATENT DOCUMENTS 1766162 10/1969 Fed. Rep. of Germany .......... 361/398

OTHER PUBLICATIONS

IBM Bulletin, Franck et al., vol. 13, No. 7, p. 1786, 12-1970.

*Primary Examiner*—Neil Abrams

[57] ABSTRACT

A flexible printed circuit has printed electrical contacts which are spring loaded to corresponding integrated circuit contacts or to corresponding other circuit contacts to form a connector.

4 Claims, 3 Drawing Figures

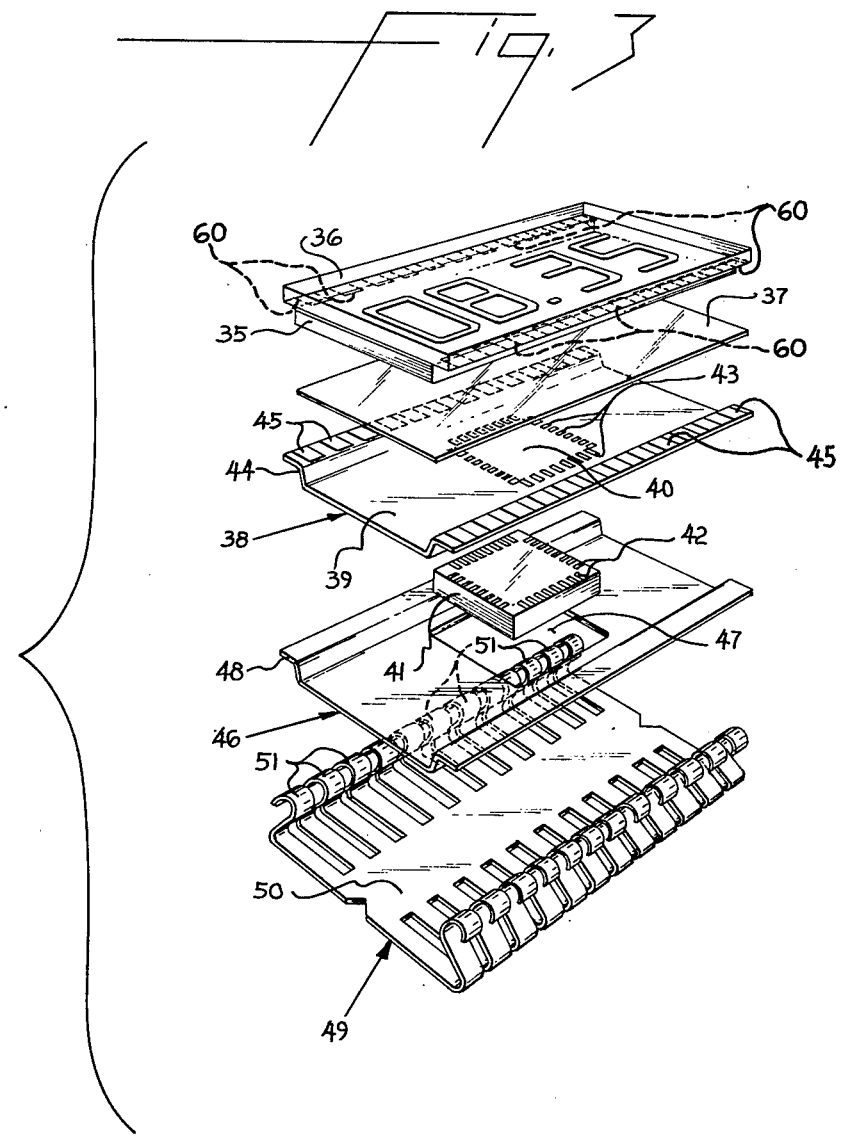
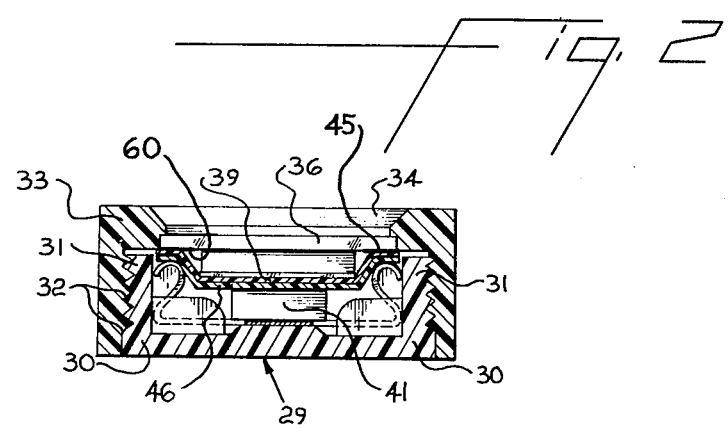

INTEGRATED CIRCUIT CONNECTOR

BACKGROUND OF THE INVENTION

The invention relates to a connector for an integrated circuit.

As a result of the increasing demand for miniaturization, use is made, on an ever increasing scale, in the computer and other industries of integrated circuits, often referred to as "chips." For handling these chips, which are usually extremely small in size, it is desirable and often necessary to position the chips in suitable connectors or holders which facilitate connecting the integrated circuit to external circuits. For that purpose a printed circuit board may be used, which is provided with a contact region for such a chip. The contact region has the usual rectangular shape, limited by contacts which correspond in position to that of the outside contacts of the chip. The circuit board has edge contact strips at two opposite sides. These edge contact strips may be soldered or plugged into an insulating holder to couple the edge strips to the further circuits.

An inconvenience of a printed circuit board is that it is relatively rigid and the chip contacts must be soldered or welded to the board contacts. This means however that the total assembly is undesirably time-consuming and has the risk of damage to the chip and moreover the replacement of defective chips in an otherwise undamaged holder is difficult.

SUMMARY OF THE INVENTION

It is the aim of the present invention to solve this problem in an efficient way by providing a connector for integrated circuits, in which at least a part of the electrical connection is established by means of contact pressure. For that purpose, the invention proposes a connector in which the printed circuit board is a flexible circuit and in which one or more resilient means press against the flexible circuit in such a way that a contact pressure is established between the printed circuit contacts and the contacts of the integrated circuit and/or between edge contact strips on the flexible circuit and external contacts.

According to the invention, use is made as it were of a printed circuit which has resilient contacts. Such a resilient printed circuit is obtained according to the invention by the combination of a socalled flexible circuit, i.e., a circuit pattern printed on a flexible sheet instead of on a rigid plate or board, and suitably shaped resilient means, so that a resilient whole is obtained with the desired properties. In this way a contact device can be realized, with which the integrated circuits can be contacted to the printed circuit without soldering, or with which the printed circuit can be connected to an outside circuit without soldering, or both. This means that the replacement of an integrated circuit is faster and easier. An additional advantage is that the flexible circuit is much thinner than a printed circuit board, so that considerable space can be saved.

According to one embodiment of the invention, a connector for an integrated circuit which has a printed circuit provided with one or more contacts for said integrated circuit and with corresponding edge contact strips for electrical connection of said integrated circuit to pads of an external circuit, and resilient means for effecting at least a portion of the electrical connection, is improved in that the printed circuit is a flexible circuit and that the resilient means is pressed against the flexible circuit to maintain a contact pressure between the contacts and the integrated circuit and/or between the edge contact strips and the external circuit pads.

This provides a unique connector in which the integrated circuit may be readily assembled initially or replaced when needed. Electrical continuity between the contacts on the edge of the chip and corresponding contacts on the flexible circuit and/or contact between the edge strips of the flexible circuit and external pads (which may be used to connect to outside circuitry) is maintained by spring like elements which maintain a contact pressure between the flexible circuit and the respective contacts or pads. This resilient contact is possible because of the use of the flexible circuit.

BRIEF DESCRIPTION OF THE DRAWINGS

The invention will be explained hereinafter with reference to the drawing, in which:

FIG. 2 is a lateral view in section of another embodiment in the form of a digital time indicating device; and FIG. 3 is an exploded perspective view of the indicating device shown in FIG. 2.

DETAILED DESCRIPTION OF THE EMBODIMENTS

Figure 1:
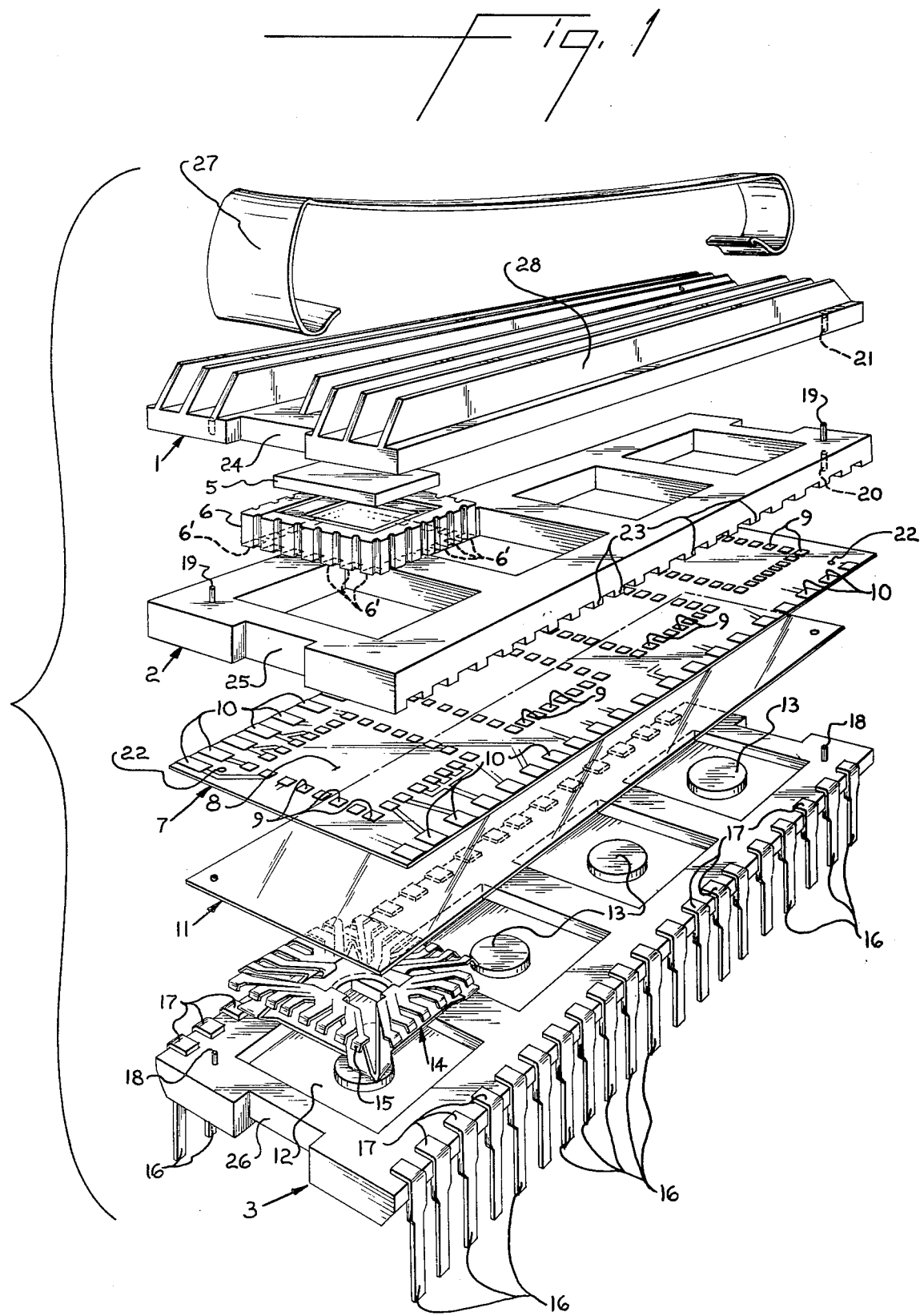
FIG. 1 is an exploded perspective view of a first embodiment of the invention.

Referring to FIG. 1, a connector for integrated circuits usually referred to as "chips" 5, has an upper plate 1, a connecting plate 2, and a lower plate 3, of which the last two are molded from an electrically insulating material thermo plastic. The connecting plate 2 has rectangular receiving holes 4 for the chips 5. Each chip 5 is positioned, i.e., located as by soldering, in a holder 6 provided with contacts 6' on its exterior which correspond in position to contacts 5' on the chip itself. The three plates are adapted, as will be described, to be held together in a sandwich like structure enclosing the chip 5.

According to this invention a flexible circuit 7 that consists of a circuit pattern 8 printed on a suitable flexible film, e.g., Mylar ® polyester or Kapton ® polyimide film, is positioned under the connecting plate 2. This flexible circuit has a number of contact patterns 8, each consisting of a rectilinear array of contacts 9. The spacing and location of contacts 9 in each pattern 8 correspond to the spacing and location of the contacts 6' on holder 6. At its longitudinal edges, the flexible circuit 7 has contact strips 10 that are connected via printed circuits to the contacts 9. Under the flexible circuit 7, there is an flexible electrical insulation strip 11 that has the same length as the flexible circuit. However, strip 11 has a lesser width and thus covers the under side of the flexible circuit entirely except for the areas of the edge strips 10. The insulation strip 11 preferably is formed of a thermally resistant polymer, e.g., Kapton ® polyimide film.

In this embodiment, the connecting plate 2 and the lower plate 3 consist of electrically insulating material and the upper plate 1 is made of a good heat conducting material to aid in dissipating the heat energy generated in the chips. Further, the upper side of the upper plate has projecting ribs 28 which serve as reinforcements as well as cooling fins.

In the lower plate 3, there are rectilinear receiving holes 12 with a round pedestal 13 in the middle. These holes are adapted to receive a resilient means such as spring assemblies 14 that are stamped and formed from sheets of spring metal. A number of spring fingers with elevated tips 15 project outwardly from arms that are joined by an apertured plate or base. The apertured base fits snugly on a pedestal 13. Tips 15 are arranged in a pattern that corresponds to the pattern of contact 9. The lower plate 3 also carries bayonets or leads 16 that have upper pads 17. Pads 17 are positioned to have the same spacings as the edge strips 10.

For the correct positioning of the upper plate 1, the connecting plate 2, the lower plate 3 and the flexible circuit 7 with respect to each other, there are pins 18 at the upper side of the lower plate in opposite corners, which pins can be inserted through corresponding holes 22, 22' in the flexible circuit 7 and insulation strip 11 into receiving holes 20 in connecting plate 2. Similarly, pins 19 on the upper surface of plate 2 fit into mating holes 21 in upper plate 1. Moreover, the under side of the connecting plate 2 has transverse ribs 23 at its longitudinal edges that are properly spaced to fit between adjacent upper pads 17 of the leads 16 on lower plate 3.

To assemble the connector, the first step is to place the spring assemblies 14 in receiving holes 12 of the lower plate 3. Then, the insulation strip 11 and the flexible circuit 7 are placed above the spring assemblies 14. With an auxiliary tool, the flexible circuit 7 is pressed with its edge strips 10 against the upper pads 17 of the leads 16 and the edge strips 10 and pads 17 are soldered by any suitable means such as a reflow process. Positioning pins 18 and the ribs 23 assure the right positioning of connecting plate 2 of the now soldered assembly of flexible circuit 7, insulation strip 11 and lower plate 3. Chips 5 in holders 6 are placed in receiving holes 4 and upper plate 1 is located on the connecting plate 2 by fitting pins 19 into holes 21.

The three plates 1, 2 and 3 are provided at their ends with aligned slots 24, 25 and 26. A resilient clamping bracket 27 is placed over these slots and extends over the upper plate and grips under the lower plate 3 at both ends thereof. In this way, an efficent latching of the three plates together is obtained and the chips 5 are electrically connected to leads 16 that are adapted for connection to other (external) circuitry. As a result of the clamping action of bracket 27, the contacts 6' on holders 6 are brought into engagement with the pads 9 of the flexible circuit 7 and the pressure exerted by the tips 15 of the fingers on spring assemblies 14 insures integrity of the connections. Thus, it is not necessary to solder the contacts 6' on holders 6 to the contacts 9 in patterns 8 and, accordingly, individual chips (supported by holders 6) can be removed and replaced when necessary or desirable simply by removing the bracket 27, replacing the chip and reassembling the connector and replacing the bracket 27. This replacement is permitted because of the use of the flexible circuit. With the flexible circuit the spring assemblies can maintain the required contact pressure on each contact of the chips (or its holder).

In the alternative embodiment of FIGS. 2 and 3, the use of an internal spring assembly and flexible circuit to establish reliable, solderless connections to the digital display panel for an electronic watch is illustrated. The watch is shown as having a casing with a bottom section 29, provided with erect side walls 30. At their outside edges, walls 30 have guiding ribs and slots 31 that slidably engage guiding ribs and slots 32 in the side walls of a lid 33. In the top side of lid 33, there is an opening 34, through which a digital display panel 35 typically based on a liquid crystal, can be observed. Within this casing consisting of the bottom section 29 and the lid 33, are disposed, from top to bottom, a digital display panel 35, e.g., a liquid crystal, covered by a transparent protecting plate 36, which in assembled position lies against the window of the casing lid. This display panel is protected at its under side by an electrically insulating strip 37 (which may be of the same type as strip 11), under which there is a flexible circuit 38 (which may be of the same type as circuit 7). The middle portion 39 of the flexible circuit 38 is recessed in a channel-like section with the longitudinal sides 44 of the flexible circuit folded upwards and outwards and carry edge contact strips 45 which are positioned at locations corresponding to the electrode connections or external edge pads 60 of the liquid crystal. The width of the strip 37 is such, that it just covers the inder side of the digital display panel, whereas the panel's electrode connections are left free. The dimensions of the flexible circuit 38 are such, that it can be pressed over the strip 37 and the digital display panel in such a way, that the edge contact strips 45 come into contact with corresponding electrode connectors of the display panel 35. The middle portion 39 of the flexible circuit 38 has contacts 43 which are arranged in patterns 40 corresponding to the locations of the pads or contacts 42 of an integrated circuit 41.

Under the flexible circuit 38 there is a second electrically insulating strip 46, which in its middle part has a rectangular hole 47, which fits closely around and positions the integrated circuit chip 41. This second insulation strip has upwards and sideways bent edges 48, corresponding to the edges 44 of the flexible circuit 39. Beneath this second strip there is a composite generally U-shaped resilient means or spring assembly 49, with a flat middle part 50, with the uprights of the U forming resilient pressure fingers 51, which are bent outwardly and downwardly to apply a resilient force or press via the strip 46 against the edge strips 45 of the flexible circuit 38. This assures a contact pressure, supported by a resilient force, between the edge strips 45 and the electrode contacts of the liquid crystal 35. The casing bottom 29 may further be provided with separating ribs 52, which are situated between the resilient fingers 51 of the resilient means 49 and assures a good positioning of the spring assembly 49.

To assemble the connector for the display device, the following steps may be followed. The integrated circuit (chip) 41, i.e., the contacts 42, is soldered to its contact pattern 40 on the flexible circuit. Next, the resilient means 49 is placed in the casing bottom. Thereafter the whole of the digital display panel 35, the strip 37, the flexible circuit 38 with soldered chip 41 and the strip 46, which covers the under side of the flexible circuit 39 around the chip 41, in sandwich array, are pressed together. This whole is kept pressed together and the casing lid 33 is slid over the side walls of the casing bottom 29 along the guiding ribs and slots 31 and 32. In this way an efficient connector is obtained, which guarantees under resilient pressure, that the electrical connections or contact between the edge strips of the flexible circuit and the electrode contacts or pads of the display panel is maintained under sufficient contact pressure. The electrical connection thus is maintained without a soldering operation or welding being necessary to maintain good electrical continuity. In a digital display device constructed this way, the display panel can be easily replaced by another one, if necessary in case of damage or failure, without any soldering or welding operation being necessary. This means that in practice such a replacement can be done efficiently, with little risk of further damage.

Although the connector of this invention has been discussed above by means of two different embodiments, it will be obvious that the principle of the invention, namely the use of a resilient support of electrical contacts of a flexible circuit as a substitute for a contact soldering operation, offers numerous other possibilities of embodiments, all within the scope of the invention. After the above description, variations and modifications will be obvious to the expert.

I claim:

1. In a connector for an integrated circuit having a flexible printed circuit provided with at least one contact for said integrated circuit and with corresponding edge contact strips for electrical connection of said integrated circuit to external pads, and resilient means for maintaining contact pressure between the contacts and the integrated circuit, the improvement wherein:

the connector comprises (a) an upper plate, (b) an electrically insulating connecting plate provided with at least one receiving hole, each hole receiving an integrated circuit, (c) an electrically insulating lower plate, provided at its upper side with at least one receiving recess for said resilient means situated in line with a receiving hole in the connecting plate, and provided at two opposite sides with external pads at the upper side of the lower plate, said flexible circuit being flat and positioned between the connecting plate and the lower plate, said contacts for said integrated circuit being situated in line with a receiving hole in the connecting plate, said edge contact strips being situated in line with said pads, there being an insulation strip covering the flexible circuit at its under side within the edge contact strips, and said resilient means being provided in each of the receiving holes in the lower plate, each resilient means having a number of separate resilient elements each of which is in line with a corresponding contact.

2. A connector according to claim 1 wherein the upper plate, the connecting plate and the lower plate each have at two opposite ends a recess, in line at each end with each other for the three plates, and a clamping bracket positioned over said recesses for keeping the three plates locked on each other.

3. A connector according to claim 1 characterized in that the upper plate is of heat-conducting metal.

4. A connector according to claim 1 characterized in that the upper plate has heat dispensing ribs at its upper side.

* * * * *